United States Patent [19]
Shen

[11] Patent Number: 5,398,531
[45] Date of Patent: Mar. 21, 1995

[54] ROTATIONAL HOUSING ASSEMBLY FOR A LOCK ASSEMBLY WITH A REMOVABLE CORE

[76] Inventor: Chao C. Shen, No. 62, Ho Shan St., Tainan, Taiwan

[21] Appl. No.: 132,531

[22] Filed: Oct. 6, 1993

[51] Int. Cl.⁶ ............................................. E05B 13/10
[52] U.S. Cl. ......................................... 70/224; 70/369; 70/371; 70/DIG. 39; 292/348
[58] Field of Search ................ 70/224, 367, 368, 369, 70/370, 371, 451, DIG. 39, 204, 372, 466; 292/348

[56] References Cited

U.S. PATENT DOCUMENTS

| | | | |
|---|---|---|---|
| 2,007,350 | 7/1935 | Schlage | 70/224 |
| 3,212,305 | 10/1965 | Russell et al. | 70/224 |
| 3,308,641 | 3/1967 | Russell et al. | 70/224 |
| 3,413,829 | 12/1968 | Russell | 70/371 |
| 3,955,387 | 5/1976 | Best et al. | 70/370 X |
| 4,995,249 | 2/1991 | Preissler et al. | 70/369 X |
| 5,317,889 | 6/1994 | Solovieff et al. | 70/371 X |

*Primary Examiner*—Lloyd A. Gall
*Attorney, Agent, or Firm*—Fitch, Even, Tabin & Flannery

[57] ABSTRACT

A rotational housing assembly for a lock assembly includes a rotational housing, a spindle, and a core retainer. The rotational housing has a sleeve which is adapted to receive a core and defines an inner periphery. A driver is formed in and extends along a longitudinal direction of the inner periphery. The spindle is received in the sleeve to rotate with the rotational housing. The spindle includes a first end adapted to operate a door latch and a second end. A cutout is formed in the second end of the spindle and extends along a longitudinal direction of the spindle and defines a recess in one edge thereof. A driver slot engages with the driver in the sleeve to retain the spindle in the rotational housing. The core retainer is received in the sleeve to engage with the second end of the spindle and has first and second ends. A stop is formed at the second end of the core retainer and engages with the recess in the spindle. A flange is formed at the first end of the core retainer and a cutout is formed in the flange for engaging with the driver to prevent rotational movement of the core retainer in the sleeve. The stop of the core retainer prevents from longitudinal movement of the core when a core catch in the core is in an extended position. The core is removable when the core catch is in a retracted position.

2 Claims, 6 Drawing Sheets 5,398,531

ROTATIONAL HOUSING ASSEMBLY FOR A LOCK ASSEMBLY WITH A REMOVABLE CORE

BACKGROUND OF THE INVENTION

1. Field of the Invention

The present invention relates to an improved rotational housing assembly for a lock assembly with a removable core.

2. Description of Related Art

In public locations, usually there are depositary boxes for people,.and the keys thereof are periodically changed for security. Lock assemblies with removable cores are thus developed in which, in addition to the normal operation key, a further control key is used to install and remove the core without affecting the normal function. It is, however, found that the manufacturing and processing of these lock assemblies are complicated, troublesome, and time-consuming. The present invention provides an improved structure in this regard.

SUMMARY OF THE INVENTION

The present invention provides a rotational housing assembly which includes a rotational housing, a spindle, and a core retainer. The rotational housing has a sleeve which is adapted to receive a removable core and defines an inner periphery. A driver is formed in and extends along a longitudinal direction of the inner periphery.

The spindle is received in the sleeve to rotate with the rotational housing and includes a first end adapted to operate a door latch and a second end. A cutout is formed in the second end of the spindle and extends along a longitudinal direction of the spindle and defines a recess in one edge thereof. A driver slot is formed in the second end of the spindle opposite to the cutout and extends along the longitudinal direction of the spindle for engaging with the driver in the sleeve to retain the spindle in the rotational housing.

The core retainer is received in the sleeve to engage with a second end of the spindle and has first and second ends. A stop is formed in the second end of the core retainer and engages with the recess in the spindle. The stop of the core retainer prevents longitudinal movement of the removable core when a core catch in the core is in an extended position. The core is removable out of the sleeve when the core catch is in a retracted position.

In another embodiment of the present invention, the core retainer further includes a flange formed in the first end thereof and a cutout is formed in the flange for engaging with the driver to prevent from rotational movement of the core retainer in the sleeve.

Other objects, advantages, and novel features of the invention will become more apparent from the following detailed description when taken in conjunction with the accompanying drawings.

DESCRIPTION OF THE PREFERRED EMBODIMENTS

Figure 7:
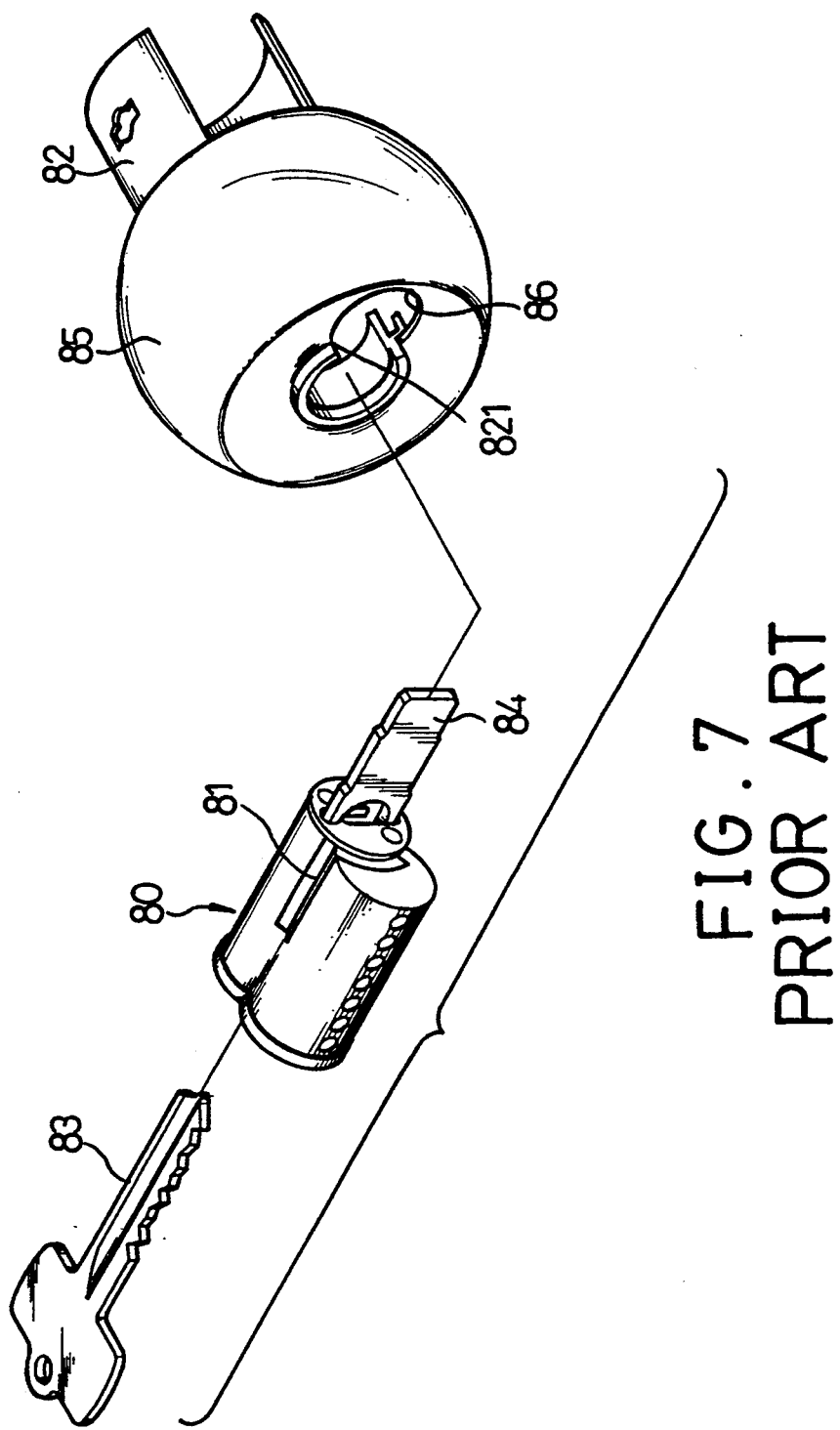
FIG. 7 is an exploded view illustrating a conventional doorknob with a removable core.

For a better understanding of the background of the invention, reference is firstly made to FIG. 7 in which part of a conventional lock assembly with a removable core is shown. Generally, a lock assembly has exterior and interior rotational housings mounted on opposite sides of a door. In FIG. 7, only the exterior rotational housing of the doorknob type is shown. A shank 82 is secured to the doorknob 85 to rotate therewith for actuating a door latch (not shown) whose function is conventional and thus will not be further described. A core 80 is removably mounted in a core hole 86 defined by the shank 82 which is securely attached to the outer end of the doorknob 85 by an engaging end 821 thereof. A control key 83 is inserted into the key way (not shown) in the core 80, and a core catch 81 in the core 80 is in an extended position to securely engage with the shank 82 upon rotation of control key 83, thereby accomplishing the installation of the core 80 which is now securely retained in the core hole 86. A normal operation key (not shown) of the lock may be inserted into the key way in the core 80 to operate a throw member 84 for unlocking the lock assembly in a conventional manner. If the operation key is to be changed, the user may simply insert the control key 83 into the key way and rotate it to withdraw the core catch 81 to a retracted position shown in FIG. 7, and then remove the core 80 together with control key 83.

Operation of changing the core 80 is convenient. Nevertheless, in order to achieve reliable retaining effect of the shank 82 in the doorknob 85, manufacturing of the corresponding construction in the shank 82 requires complicated and troublesome processing procedures, especially the engaging end 821 of the shank 82. Furthermore, the assembly between the shank 82 and the doorknob 85 is time-consuming due to the complicated design.

The invention provides an improved structure to obviate the above-mentioned problems.

Figure 1:
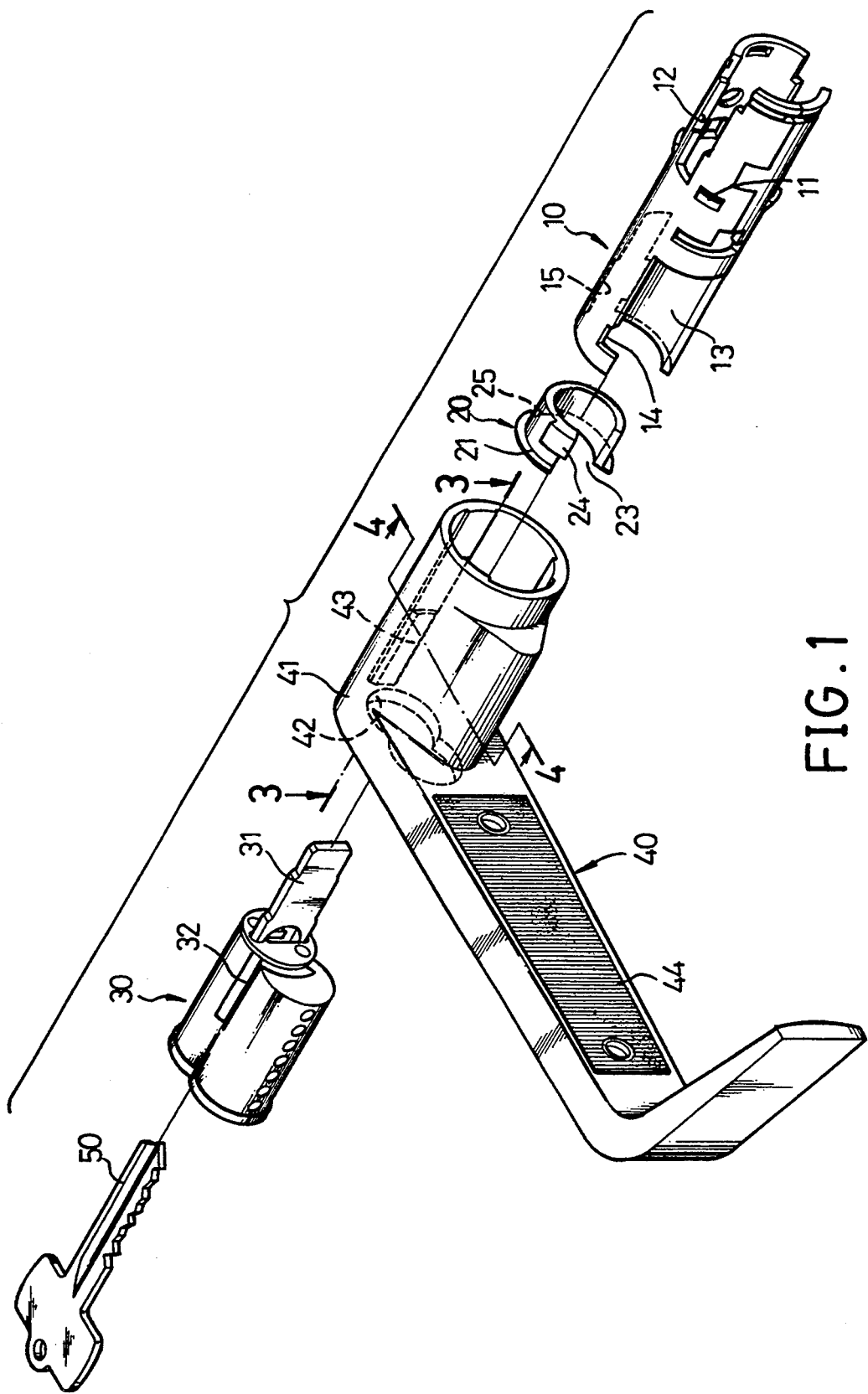
Fig. 1 is an exploded view of an exterior rotational housing of a lock assembly with a removable core in accordance with the present invention.
Figure 2:
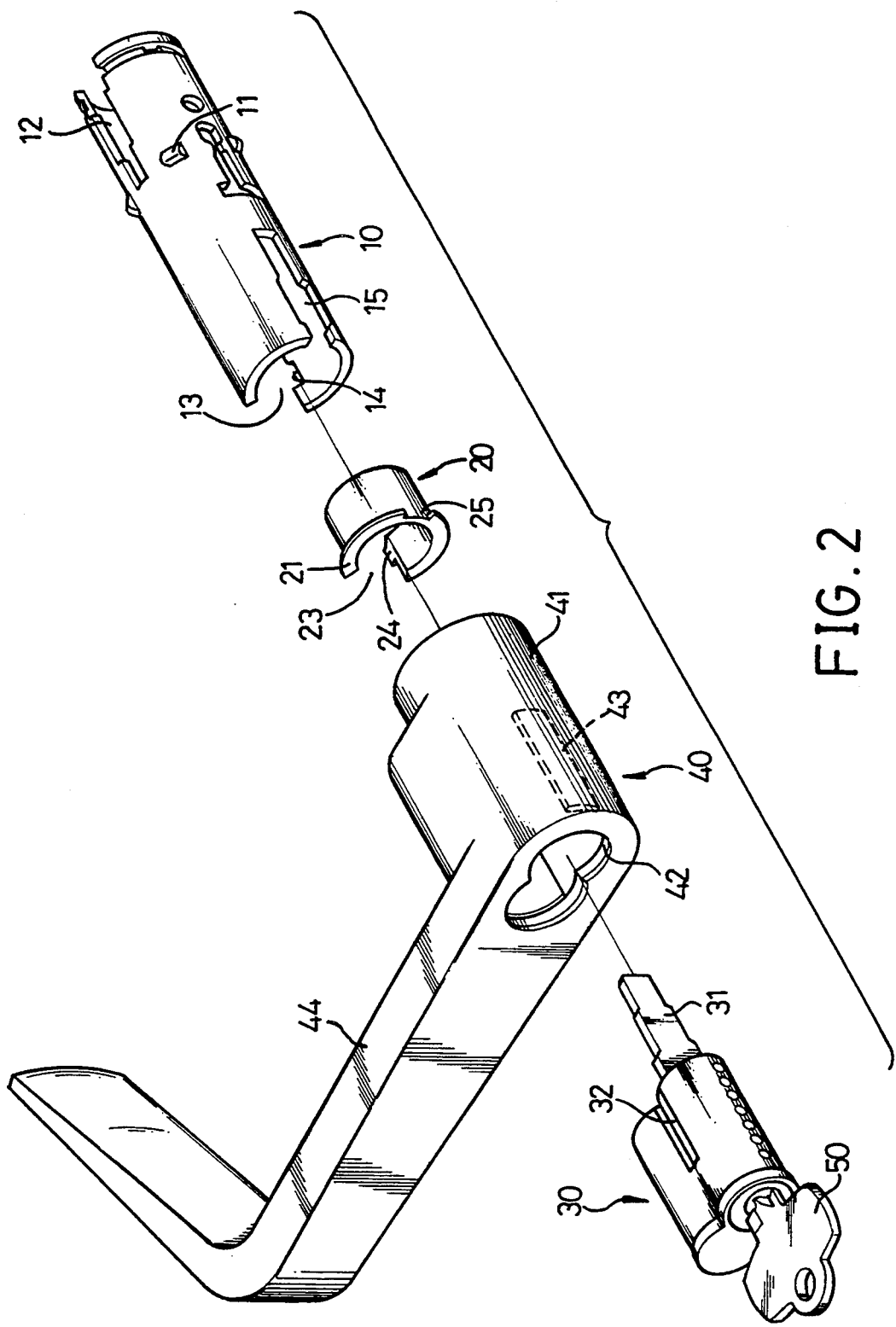
FIG. 2 is another exploded view of the exterior rotational housing from the opposite side.
Figure 3:
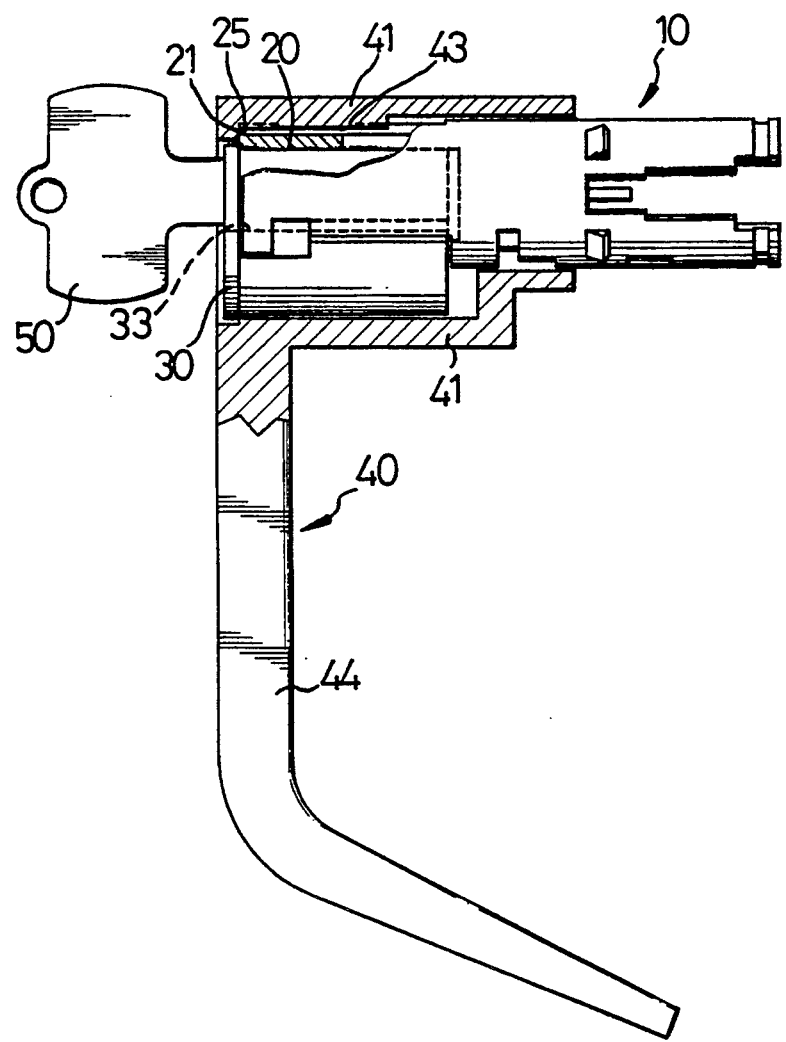
FIG. 3 is a top elevational view, partly sectioned, of the exterior rotational housing assembly in an assembled status.

FIGS. 1 through 3 show an exterior rotational housing assembly of a door lock in accordance with the present invention in which the other elements, such as the interior rotational housing and the latch means, are omitted for clarity as they are beyond the scope of the present invention.

As shown in FIGS. 1 and 2, the exterior rotational housing assembly includes an exterior rotational housing 40 mounted on the exterior side of a door and having a sleeve 41 with an inner periphery 42, a spindle 10 mounted in the exterior rotational housing 40 to rotate therewith, a core 30 removably mounted in the spindle 10, and a substantially C-shaped tubular core retainer 20 to retain the core 30.

The C-shaped tubular core retainer 20 includes a flange 21 at one of two ends thereof and defines a longitudinal gap 23, a cutout 25 in the flange 21, and a stop 24 formed at the other end thereof. A driver 43 is formed on the inner periphery 42 of the sleeve 41 and extends along a longitudinal direction of the sleeve 41. The spindle 10 has four projections 11 and two engaging slots 12 in a first end thereof for actuating a door latch under operation of the handle 44 which is integral with the sleeve 41, which is conventional and thus will not be further described. A cutout 13 is formed in the second end of the spindle 10 and extends along a longitudinal direction of the spindle 10 and defines a recess 14 in one edge thereof. Opposite to the cutout 13, a driver slot 15 is formed in the second end of the spindle 10 and also extends along the longitudinal direction of the spindle 10.

In assembly, the core retainer 20 is inserted into the spindle 10 with the stop 24 engaging with the recess 14 in the cutout 13 upon a rotation of the core retainer 20. Then, the spindle 10 together with the core retainer 20 is inserted into the sleeve 41 of the exterior rotational housing 40 with the driver 43 engaging with cutout 25 in the core retainer 20 and the driver slot 15 in the spindle 10, thereby securing the core retainer 20 in position, as shown in FIG. 3. Provision of cutout 25 prevents rotational movement of the core retainer 20 in the sleeve 41.

Figure 4:
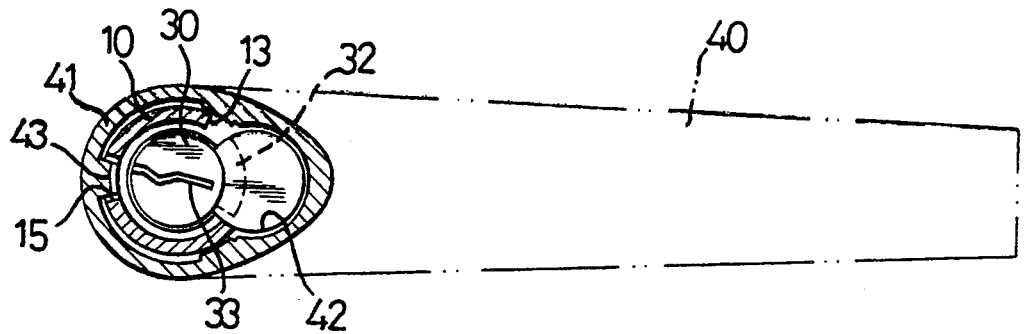
FIG. 4 is a schematic cross-sectional view with the core in a removable position.
Figure 5:
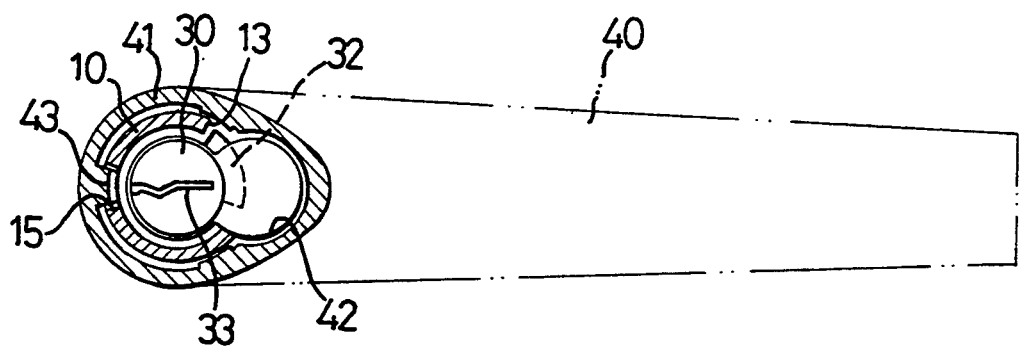
FIG. 5 is a schematic cross-sectional view with the core in a secured position.

Thereafter, a core 30, with a core catch 32 and a throw member 31 of a conventional design, is inserted into the sleeve 41 in the exterior rotational housing 40, as shown in FIG. 4. The core 30 is then retained in the exterior rotational housing 40 by inserting a control key 50 into a key way in the core 30 and then rotating the control key 50 to urge the core catch 32 to an extended position (the throw member 31 will not be actuated) as shown in FIG. 5, in which the stop 24 prevents longitudinal movement of the core catch 32 in the exterior rotational housing 40. Removal of the core 30 may be easily achieved by using the control key 50 to withdraw the core catch 32. Thus, the lock assembly is now in an operative condition and can be unlocked by a normal operation key (not shown) which does not operate the core catch 32.

It is appreciated that the exterior rotational housing 40 may be replaced by the doorknob 85 in FIG. 7 without affecting the function.

Figure 6:
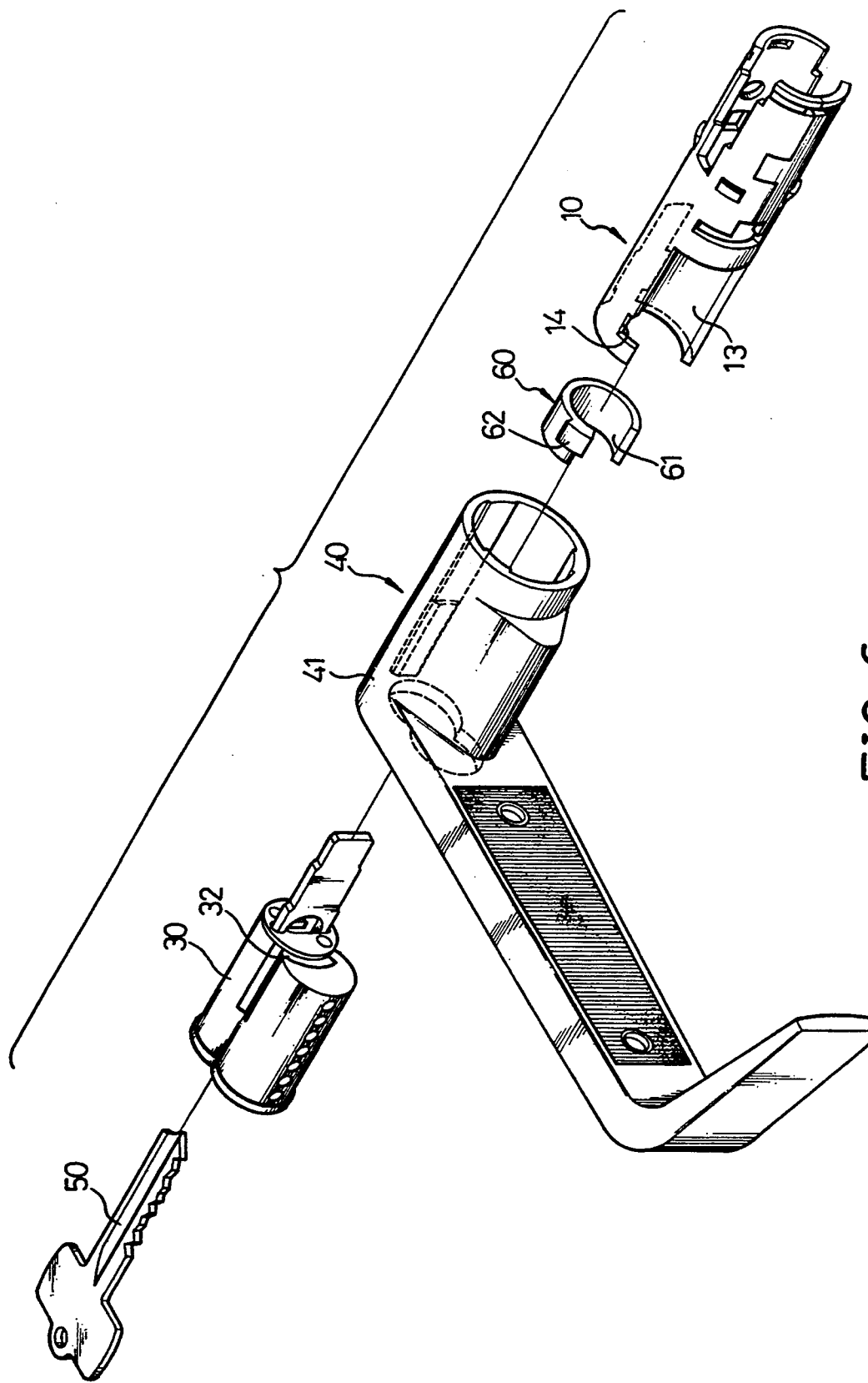
FIG. 6 is an exploded view illustrating another embodiment of the present invention.

FIG. 6 shows another embodiment of the invention in which the core retainer 60 includes a stop 62 and a cutout 61, the flange 21 in the above embodiment is omitted in this embodiment. Assembly and operation of this embodiment are the same as that illustrated in the above-mentioned embodiment and thus is not redundantly described.

Although the invention has been explained in relation to its preferred embodiment, it is to be understood that many other possible modifications and variations can be made without departing from the spirit and scope of the invention as hereinafter claimed.

What is claimed is:

1. A rotational housing assembly for a lock assembly comprising:

a rotational housing having a sleeve which is adapted to receive a removable core and defines an inner periphery, a driver being formed in and extending along a longitudinal direction of said inner periphery;

a spindle received in said sleeve to rotate with the rotational housing, said spindle comprising a first end adapted to operate a door latch and a second end, a cutout being formed in said second end of said spindle and extending along a longitudinal direction of said spindle and defining a recess in one edge thereof, a driver slot being formed in said second end of said spindle opposite to said cutout and extending along said longitudinal direction of said spindle for engaging with said driver in said sleeve to retain said spindle in said rotational housing; and a core retainer received in said sleeve for engaging with said second end of said spindle and having first and second ends, a stop being formed at said second end of said core retainer and engaging with said recess in said spindle, said stop preventing longitudinal movement of said core when a core catch in said core is in an extended position, and said core is removable out of said sleeve when said core catch is in a retracted position.

2. The rotational housing assembly as claimed in claim 1, wherein said core retainer further comprises a flange formed in said first end thereof and a second cutout is formed in said flange for engaging with said driver to prevent rotational movement of said core retainer in said sleeve.

* * * * *